(12) United States Patent
Jang

(10) Patent No.: US 8,108,185 B2
(45) Date of Patent: Jan. 31, 2012

(54) ELECTROSTATIC DISCHARGE VOLTAGE RESISTIVE CURRENT MODELING METHOD OF ELECTROSTATIC DISCHARGE PROTECTION DEVICE

(75) Inventor: Chang Soo Jang, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 448 days.

(21) Appl. No.: 12/338,475

(22) Filed: Dec. 18, 2008

(65) Prior Publication Data

US 2009/0171635 A1  Jul. 2, 2009

(30) Foreign Application Priority Data

Dec. 26, 2007 (KR) .................. 10-2007-0137245

(51) Int. Cl.
*G06F 17/50* (2006.01)
(52) U.S. Cl. ............... 703/2; 703/13; 703/17; 257/170; 257/355
(58) Field of Classification Search .............. 703/2, 6, 703/17, 5, 13, 19; 257/328, 360, 170, 355; 361/56

See application file for complete search history.

(56) References Cited

U.S. PATENT DOCUMENTS

| | | | |
|---|---|---|---|
| 5,714,784 A * | 2/1998 | Ker et al. ...................... | 257/360 |
| 2005/0167742 A1* | 8/2005 | Challa et al. .................. | 257/328 |
| 2008/0251941 A1* | 10/2008 | Leedy ........................... | 257/777 |
| 2010/0172060 A1* | 7/2010 | Woo et al. ...................... | 361/56 |

* cited by examiner

*Primary Examiner* — Thai Phan
(74) *Attorney, Agent, or Firm* — The Law Offices of Andrew D. Fortney; Andrew D. Fortney; Theresa J. Mahan

(57) ABSTRACT

Provided is a method for modeling an ESD breakdown current. According to one variation, a first proportional constant is based on a circumference of the ESD protection device and a second proportional constant based on an area of the ESD protection device. A dual first order equation is derived by sampling circumferences and areas of two ESD protection devices. According to another variation, an equation is defined in which a third value (an ESD breakdown current) is a sum of a first value and a second value, the first value being obtained by multiplying a circumference of an ESD protection device by a first proportional constant, the second value being obtained by multiplying an area of the ESD protection device by a second proportional constant. Then, circumferences and areas of first and second ESD protection samples are calculated. Next, first and second equations are derived by reflecting the first and second circumferences and areas to the equation.

20 Claims, 3 Drawing Sheets

ELECTROSTATIC DISCHARGE VOLTAGE RESISTIVE CURRENT MODELING METHOD OF ELECTROSTATIC DISCHARGE PROTECTION DEVICE

CROSS-REFERENCE TO RELATED APPLICATIONS

The present application claims the benefit of priority under 35 U.S.C. §119 to Korean Patent Application No. 10-2007-0137245, filed on Dec. 26, 2007, the entire contents of which are incorporated herein by reference.

BACKGROUND

Embodiments relate to an electrostatic discharge (ESD) voltage resistive current modeling method of an ESD protection device.

If electronic components used in a communication device are exposed to an ESD phenomenon, their internal circuits may be damaged or rendered unstable during operation. In relation to the ESD phenomenon, when an electronic device contacts a charge transferable object, static electricity is discharged to affect its internal circuit. For example, when a human body contacts an antenna or an external connection part of a communication device, the ESD phenomenon may occur.

To protect internal circuits from the ESD phenomenon, an electronic circuit is equipped with an ESD protection device. The ESD protection device may include a diode and be formed using a semiconductor fabrication process.

FIG. 1 is a plan view illustrating a structure of an ESD protection device. FIG. 2 is a graph illustrating an ESD current characteristic as a function of the voltage applied to an ESD protection device.

The ESD protection device 10 of FIG. 1 is a diode including an N-type diffusion layer 11, a junction layer 12, a P-type diffusion layer 13, and a contact electrode 14. The N-type diffusion layer 11 operates as an anode and the P-type diffusion layer 13 operates as a cathode.

For an the anode (i.e., N-type diffusion layer) 11 of the ESD protection device 10 having a length "a" of 30 µm and a width "b" of 10 µm, the ESD current as a function of voltage) is as shown in FIG. 2 for a given fabrication process.

In FIG. 2, the y-axis (vertical axis) represents the current through the ESD device at various voltages, in amperes (A). A first x-axis (horizontal axis, below the graph) represents the voltage V applied to a diode, and a second x-axis (above the graph) represents the current through the ESD device on a logarithmic scale.

In FIG. 2, measurement line c indicates a current of the anode 11 based on the voltage applied to the diode, and measurement line d indicates an amount of a leakage current based on the voltage applied to the diode.

Referring to FIG. 2, the measurement lines c and d infinitely increase beyond the measurement range (e.g., above point e). An ESD current at the point e is about 126 mA, and this means that the diode begins to breakdown at the point e. Accordingly, the above ESD current (e.g., at point e) at a voltage that the ESD device can withstand (e.g., the "withstanding voltage") can be regarded as a breakdown current.

Based on this measurement result, the unit circumference of the anode 11 (i.e., the N-type diffusion layer) in the ESD protection device 10 can be calculated using Equation 1 below.

ESD breakdown current per anode unit circumference=$I_{esd}$÷circumference of anode  [Equation 1]

where $I_{esd}$ represents an ESD current at the withstanding voltage, and the circumference of anode is (a+b)×2 (where a and b are as shown in FIG. 1).

Accordingly, if the ESD breakdown current (i.e., at the withstanding voltage) is 126 mA and the circumference of the anode 11 is 80 µm, the ESD breakdown current per anode unit circumference is 1.575 mA/µm.

Since this calculated ESD breakdown current depends on a first order function for the anode circumference, a linear relationship of an ESD breakdown current characteristic with respect to a diode area cannot be accurately expressed. Therefore, its accuracy can be improved.

For example, if a plurality of diodes are combined and used as one diode, they have the same ESD breakdown current characteristic as one diode having the same anode area as the plurality of diodes. However, an ESD breakdown current calculated using the first order function for circumference in Equation 1 has a different result. That is, if two diodes have the same area but different circumferences, or have the same circumference but different areas, it is difficult to normalize the ESD breakdown current characteristics. For this reason, when the ESD protection device is designed, it is typically designed larger than actually required in order to allow for errors in the ESD breakdown current. This reduces area efficiency of a design.

SUMMARY

Embodiments of the present disclosure provide a method for modeling an ESD breakdown current of an ESD protection device that clearly define a linear relationship of the ESD breakdown current characteristic with respect to the ESD device (e.g., diode) area and circumference, without using a related art modeling method that depends solely on a first order function (e.g., the anode circumference).

Embodiments also provide a method for modeling an ESD breakdown current of an ESD protection device capable of normalizing the ESD breakdown current characteristic even when different ESD devices (e.g., diodes) have the same area and a different circumference, or the same circumference and different areas.

In one aspect, a method for modeling an ESD breakdown current of an ESD protection device comprises defining a first proportional constant based on a circumference of the ESD protection device and a second proportional constant based on an area of the ESD protection device; and deriving a dual first order equation by sampling circumferences and areas of two ESD protection devices.

In another aspect, a method for modeling an ESD breakdown current of an ESD protection device comprises defining an equation in which a third value is an ESD breakdown current, wherein the third value is a sum of a first value and a second value, the first value being obtained by multiplying a circumference of the ESD protection device by a first proportional constant, the second value being obtained by multiplying an area of the ESD protection device by a second proportional constant; calculating a first circumference and a first area of a first sample ESD protection device and calculating a second circumference and a second area of a second sample ESD protection device; and deriving a first equation by including the first circumference and the first area in the equation and deriving a second equation by including the second circumference and the second area in the equation.

The details of one or more embodiments are set forth in the accompanying drawings and the description below. Other features will be apparent from the description and drawings, and from the claims.

DETAILED DESCRIPTION OF THE EMBODIMENTS

A method for modeling an electrostatic discharge (ESD) current at a withstanding voltage (i.e., an ESD breakdown current) in an ESD protection device will be described in detail with reference to the accompanying drawings.

In the description of various embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more additional intervening layers may also be present.

Figure 3:
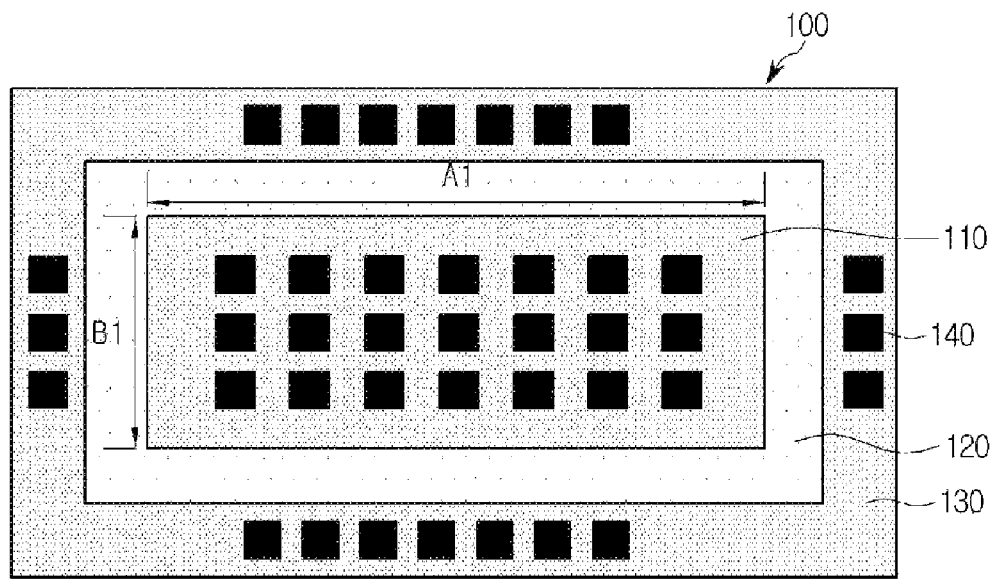
FIG. 3 is a plan view illustrating a first exemplary ESD protection device 100 used in an exemplary method for modeling and/or estimating an ESD breakdown current in an ESD protection device according to embodiments of the disclosure.
Figure 4:
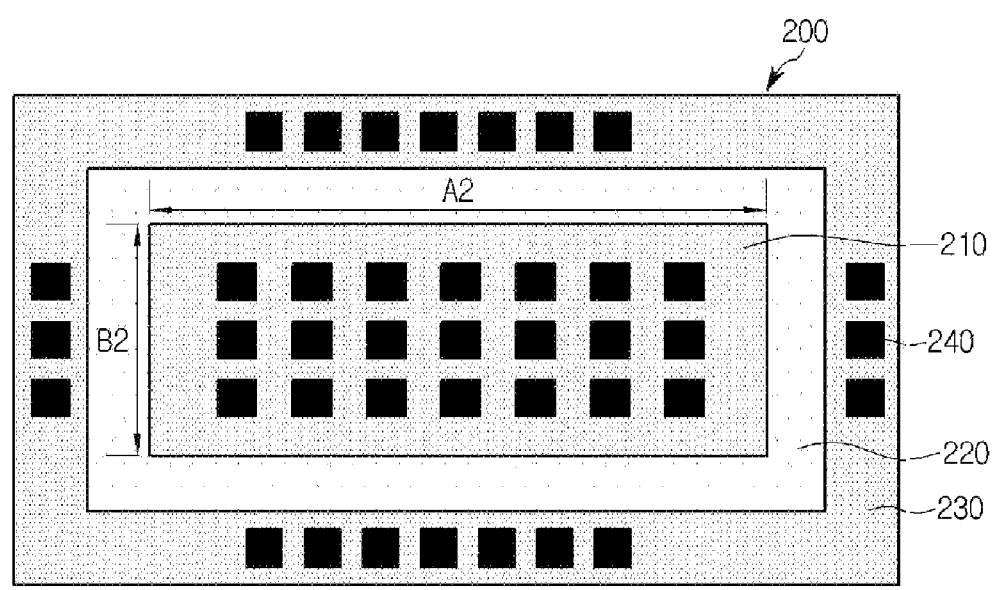
FIG. 4 is a plan view illustrating a second exemplary ESD protection device 200 used in an exemplary method for modeling and/or estimating an ESD breakdown current of an ESD protection device according to embodiments of the disclosure.
Figure 5:
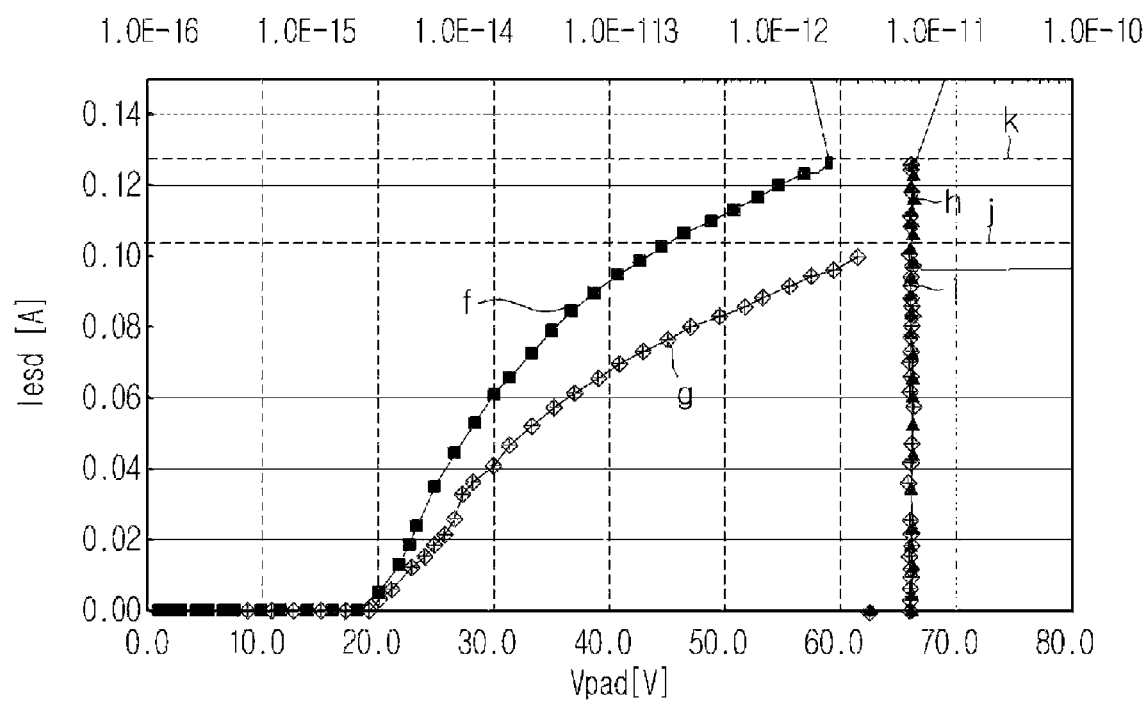
FIG. 5 is a graph measuring an ESD breakdown current characteristic of a first exemplary ESD protection device 100 and a second exemplary ESD protection device 200 used in an exemplary method for modeling an ESD breakdown current of ESD protection devices according to embodiments of the disclosure.

FIG. 3 is a plan view illustrating a first exemplary ESD protection device 100 used in an exemplary method for modeling an ESD breakdown current in an ESD protection device according to embodiments of the disclosure. FIG. 4 is a plan view illustrating a second exemplary ESD protection device 200 used in an exemplary method for modeling an ESD breakdown current in an ESD protection device according to embodiments of the disclosure. FIG. 5 is a graph measuring an ESD breakdown current characteristic in a first exemplary ESD protection device 100 and a second exemplary ESD protection device 200 used in an exemplary method for modeling an ESD breakdown current of ESD protection devices according to embodiments of the disclosure.

Referring to FIGS. 3 and 4, the first ESD protection device 100 and the second ESD protection device 200 comprise diodes including N-type diffusion layers 110 and 210, junction layers 120 and 220, P-type diffusion layers 130 and 230, and contact electrodes 140 and 240. The N-type diffusion layers 110 and 210 operate as an anode and the P-type diffusion layers 130 and 230 operate as a cathode.

An equation of a method for modeling the ESD breakdown current may include an equation for obtaining an ESD breakdown current per anode unit circumference and an equation for obtaining an ESD breakdown current per anode unit area as a dual first order function. The equation of the method clearly defines a linear relationship of an ESD breakdown current characteristic with respect to the ESD device (e.g., diode) area and circumference, and also makes possible normalization and accurate modeling of an ESD voltage resistive characteristic.

Accordingly, to drive a modeling equation according to an embodiment of the disclosure, the first and second ESD protection devices 100 and 200 are used as two modeling samples. Such devices may correspond to the "dual". Alternatively, the two first-order factors in the exemplary equation may correspond to the "dual".

The first and second exemplary ESD protection devices 100 and 200 have anodes with different respective sizes (i.e., at least one of the lengths A1 and A2 and the widths B1 and B2 are different from each other), but the numerical values of A1, A2, B1, and B2 are not initially determined.

Figure 1:
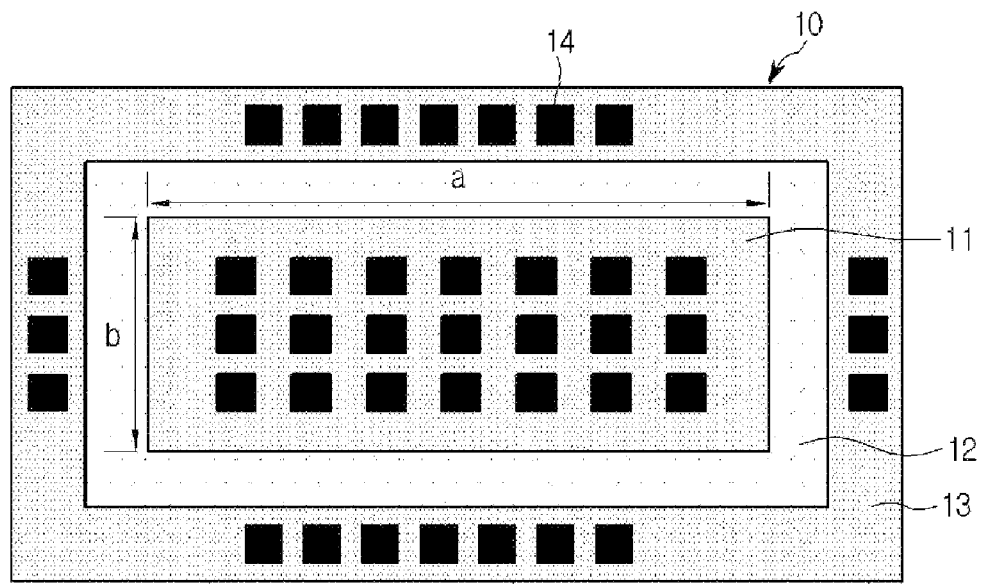
FIG. 1 is a plan view illustrating an exemplary structure of an ESD protection device.
Figure 2:
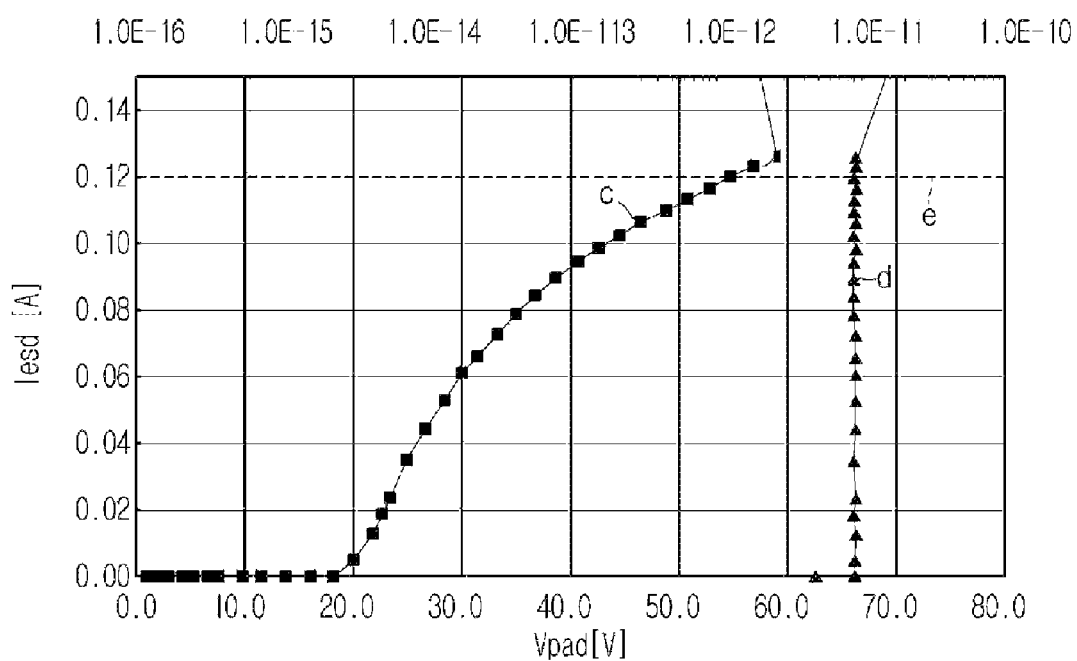
FIG. 2 is a graph illustrating an ESD breakdown current characteristic of an exemplary ESD protection device.

An ESD breakdown current in the first and second ESD protection devices 100 and 200 is measured as illustrated in FIG. 5. The graph in FIG. 5 is basically similar to that of FIG. 2 and thus its overlapping description will be omitted.

Measurement lines f and g illustrate currents of the anodes 110 and 210 based on a voltage applied to the first and second ESD protection devices 100 and 200, and measurement lines h and i illustrate an amount of a leakage current based on a voltage applied to the first and second ESD protection devices 100 and 200. Like FIG. 2, there are points k and j where measurement lines infinitely increase beyond the measurement range. However, ESD breakdown currents at the points k and j are different from each other in the first and second ESD protection devices 100 and 200. That is, the first and second ESD protection devices 100 and 200 have different respective breakdown current values.

Hereinafter, a method for modeling an ESD breakdown current in an ESD protection device will be described through exemplary equations.

First, a circumference of the anode 110 (hereinafter, referred to as a first anode circumference) L1 and an anode area (hereinafter, referred to as a first anode area) S1 of the first ESD protection device 100 can be defined as follows:

First anode circumference $(L1) = (A1+B1) \times 2$

First anode area $(S1) = A1 \times B1$ [Equation 2]

A circumference of the anode 210 (hereinafter, referred to as a second anode circumference) L2 and an anode area (hereinafter, referred to as a second anode area) S2 of the second ESD protection device 200 can be defined as follows:

Second anode circumference $(L2) = (A2+B2) \times 2$

Second anode area $(S2) = A2 \times B2$ [Equation 3]

Next, if introducing concepts of a proportional constant for circumference F1 (hereinafter, referred as a first proportional constant) and a proportional constant for area F2 (hereinafter, referred to as a second proportional constant) of the first and second ESD protection devices 100 and 200 with respect to an ESD breakdown current, the ESD breakdown current I1 (hereinafter, referred to as a first ESD breakdown current) of the first ESD protection device 100 is calculated as follows:

First ESD breakdown current $(I1) = (F1 \times L1) + (F2 \times S1)$ [Equation 4]

Additionally, an ESD breakdown current I2 (hereinafter, referred to as a second ESD breakdown current) of the second ESD protection device 200 is calculated as follows:

Second ESD breakdown current $(I2) = (F1 \times L2) + (F2 \times S2)$ [Equation 5]

The above Equations 4 and 5 are solved through a dual first order equation using F1 and F2 as parameters. It is as follows:

$$F1=(I1\times(S2\div S1)-I2)\div(L1\times(S2\div S1)-L2)$$

$$F2=(I1\times(L2\div L1)-I2)\div(S1\times(L2\div L1)-S2) \quad \text{[Equation 6]}$$

Accordingly, the first proportional constant F1 is based on a ratio of the area of the second ESD device to the area of the first ESD device, and the second proportional constant F2 is based on a ratio of the circumference of the second ESD device to the circumference of the first ESD device. By using the first proportional constant F1 and the second proportional constant F2, the ESD breakdown current characteristic (the measurement lines k and j of FIG. 5) can be predicted, and a normalized ESD breakdown current characteristic model can be designed, regardless of the area and circumference of the ESD protection devices.

For example, even if a plurality of diodes are used in parallel or serial, as a single diode or as one diode having the same anode area as a plurality of diodes, a normalized ESD breakdown current can be predicted using the following Equation 7.

ESD breakdown current=(first proportional constant (F1)×circumference of ESD protection device)+ (second proportion constant (F2)×area of ESD protection device)     [Equation 7]

From Equation 7, an ESD device for an integrated circuit that has a minimum size sufficient to provide a predetermined ESD breakdown current can be designed and fabricated. Thus, the method may further comprise designing an ESD device (or an integrated circuit having a plurality of ESD devices) with a circumference and area providing a predetermined ESD breakdown current, and fabricating an integrated circuit having such ESD devices designed therefor.

Another aspect of the present invention includes a computer program and/or computer software, implementable and/or executable in a general purpose computer or workstation equipped with a conventional processor, configured to perform one or more steps of the present method(s). Thus, a further aspect of the invention relates to a computer-readable medium containing a set of instructions which, when executed by an appropriate processing device (e.g., a signal processing device, such as a microcontroller, microprocessor or DSP device), is configured to perform the above-described method(s).

For example, the computer program may be on any kind of computer-readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

According to embodiments of the disclosure, beneficial effects of the invention include the following:

First, since a linear relationship of an ESD breakdown current characteristic for the area and circumference of an ESD device (e.g., a diode) can be clearly defined, the error tolerance of the predicted ESD breakdown current in the ESD protection device can be drastically reduced.

Second, since a normalized and accurately modeled ESD breakdown current characteristic is possible, it is unnecessary to design an ESD protection device larger than that actually required in order to allow for errors in the estimated breakdown current. Therefore, the area of the ESD protection device can be drastically reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for modeling an electrostatic discharge (ESD) breakdown current in an ESD protection device comprising a diode including an anode and a cathode, the anode comprising a first conductivity type diffusion layer, and the cathode comprising a second conductivity type diffusion layer, the method comprising:
   defining a first proportional constant based on a circumference of the anode of the ESD protection device and a second proportional constant based on an area of the anode of the ESD protection device; and
   deriving a dual first order equation by sampling circumferences and areas of anodes of two ESD protection devices.

2. The method according to claim 1, further comprising calculating the dual first order equation using the first and second proportional constants as variables.

3. The method according to claim 2, further comprising calculating the first and second proportional constants for the dual first order equation to generate a model equation for the ESD breakdown current using the circumference and area of the anodes of the ESD protection devices as variables.

4. The method according to claim 3, comprising predicting a first ESD breakdown current of a first ESD protection device according to:
   the first ESD breakdown current=(the first proportional constant·a first anode circumference)+(the second proportional constant·a first anode area).

5. The method according to claim 4, comprising predicting a second ESD breakdown current of a second ESD protection device according to:
   the second ESD breakdown current=(the first proportional constant·a second anode circumference)+(the second proportional constant·a second anode area).

6. The method according to claim 5, wherein the first proportional constant and the second proportional constant are calculated according to:
   the first proportional constant=(the first ESD breakdown current·[the second anode area/the first anode area]−the second ESD breakdown current)/(the first anode circumference·[the second anode area/the first anode area]−the second anode circumference); and
   the second proportional constant=(the first ESD breakdown current·[the second anode circumference/the first anode circumference]−the second ESD breakdown current)/(the first anode area·[the second anode circumference/the first anode circumference]−the second anode area).

7. The method according to claim 6, wherein the ESD breakdown current of the ESD protection device is calculated according to:

the ESD breakdown current=(the first proportional constant·the circumference of the ESD protection device)+(the second proportional constant·the area of the ESD protection device).

8. The method according to claim 2, comprising:

calculating numerical values of the first and second proportional constants as constants in the dual first order equation; and deriving a normalized model equation for the ESD breakdown current by including the circumference and area of the anode of a third ESD protection device in the dual first order equation as variables.

9. The method according to claim 1, wherein the two ESD protection devices comprise anodes having different respective sizes.

10. The method according to claim 9, wherein the anodes of the two ESD protection devices have different respective lengths and/or widths.

11. The method according to claim 1, wherein the diode comprises an N-type diffusion layer operating as the anode, a P-type diffusion layer operating as the cathode, and a junction layer between the N-type diffusion layer and the P-type diffusion layer.

12. The method according to claim 1, wherein the ESD protection device has a circumference and an area defined by the circumference and the area of the anode of the ESD protection device, respectively.

13. A method for modeling an ESD breakdown current in an ESD protection device comprising a diode including an anode and a cathode, the anode comprising a first conductivity type diffusion layer, and the cathode comprising a second conductivity type diffusion layer, the method comprising:

defining an equation in which the ESD breakdown current is a sum of a first value and a second value, the first value being obtained by multiplying a circumference of the anode of the ESD protection device by a first proportional constant, the second value being obtained by multiplying an area of the anode of the ESD protection device by a second proportional constant;

calculating a first circumference and a first area of the anode of a first sample ESD protection device and calculating a second circumference and a second area of the anode of a second sample ESD protection device; and deriving a first equation by including the first circumference and the first area in the equation and deriving a second equation by including the second circumference and the second area in the equation.

14. The method according to claim 13, further comprising calculating a dual first order equation using the first proportional constant and the second proportional constant as variables.

15. The method according to claim 14, further comprising designing a third ESD protective device with a circumference and area providing a predetermined ESD breakdown current in accordance with the dual first order equation.

16. The method according to claim 15, further comprising fabricating an integrated circuit having the third ESD protective device designed therefor.

17. The method according to claim 13, wherein the diode comprises an N-type diffusion layer operating as the anode, a P-type diffusion layer operating as the cathode, and a junction layer between the N-type diffusion layer and the P-type diffusion layer.

18. The method according to claim 17, wherein the ESD protection device has a circumference defined by the circumference of the anode and an area defined by the area of the anode.

19. The method according to claim 13, wherein the first and second sample ESD protection devices comprise anodes having different respective sizes.

20. The method according to claim 19, wherein the anodes of the first and second sample ESD protection devices have different respective lengths and/or widths.

* * * * *